US008314726B2

(12) United States Patent
Cannillo et al.

(10) Patent No.: US 8,314,726 B2
(45) Date of Patent: Nov. 20, 2012

(54) TIME STAMP GENERATION

(75) Inventors: Francesco Cannillo, Corato (IT); Patrick Merken, Montenaken (BE); Munir Abdalla Mohamed, Khartoum (SD); Osman Allam, Leuven (BE)

(73) Assignee: IMEC, Leuven (BE)

( * ) Notice: Subject to any disclaimer, the term of this patent is extended or adjusted under 35 U.S.C. 154(b) by 53 days.

(21) Appl. No.: 13/082,322

(22) Filed: Apr. 7, 2011

(65) Prior Publication Data

US 2011/0248874 A1 Oct. 13, 2011

Related U.S. Application Data

(60) Provisional application No. 61/321,744, filed on Apr. 7, 2010.

(51) Int. Cl.
*H03M 1/10* (2006.01)

(52) U.S. Cl. ........ 341/120; 341/118; 341/121; 341/155; 341/156; 341/166

(58) Field of Classification Search .......... 341/118-121, 341/155, 156, 166
See application file for complete search history.

(56) References Cited

U.S. PATENT DOCUMENTS 5,166,959 A 11/1992 Chu et al.
5,835,552 A * 11/1998 Kusumoto et al. .............. 377/24
5,838,754 A 11/1998 Gorbies et al.
6,587,187 B2 * 7/2003 Watanabe et al. ............ 356/5.01
7,106,239 B1 * 9/2006 Keskin .......................... 341/157
7,196,778 B2 * 3/2007 Lin et al. ....................... 356/5.01
7,298,423 B1 * 11/2007 Gudmondson ............... 348/639
7,574,632 B2 * 8/2009 Sartschev et al. ............. 714/700
7,609,756 B2 * 10/2009 Wood ............................ 341/155
7,653,500 B2 * 1/2010 Kobayashi ...................... 702/69
7,782,242 B2 * 8/2010 Rivoir ........................... 341/166
7,791,525 B2 * 9/2010 Rivoir ........................... 341/166
8,050,148 B2 * 11/2011 Brantley et al. ............... 368/120
8,090,068 B2 * 1/2012 Sun et al. ...................... 375/376
2007/0071080 A1 * 3/2007 Sartschev et al. ............. 375/224
2010/0001769 A1 1/2010 Brantley et al.

FOREIGN PATENT DOCUMENTS

EP 0529875 11/1996
WO WO 2007/093221 8/2007

OTHER PUBLICATIONS

European Search Report dated May 30, 2011 for EP Application No. 11161538.

* cited by examiner

*Primary Examiner* — Linh Nguyen
(74) *Attorney, Agent, or Firm* — Knobbe Martens Olson & Bear LLP

(57) ABSTRACT

A circuit and method for providing a digital output indicative of the time at which an event occurred is disclosed. In one aspect, the circuit includes a fine timing circuit configured to determine in which sub-interval of a clock period the event occurred, and a correction circuit configured to correct an erroneous offset between a first and second clock signals in the fine timing circuit. The correction circuit includes a synch circuit configured to determine in which half of the clock period the event occurred so as to correct for erroneous offset in the fine timing circuit.

11 Claims, 11 Drawing Sheets

TIME STAMP GENERATION

CROSS REFERENCE TO RELATED APPLICATIONS

This application claims priority under 35 U.S.C. §119(e) to U.S. provisional patent application 61/321,744 filed on Apr. 7, 2010, which application is hereby incorporated by reference in its entirety.

BACKGROUND OF THE INVENTION

1. Field of the Invention

The disclosed technology relates to improvements in or relating to time stamp generation, and is more particularly concerned with time stamp generation in time-to-digital converters.

2. Description of the Related Technology

Time stamps are normally generated in two portions, namely, a coarse part corresponding to the most significant bits (MSBs) and a fine part corresponding to the least significant bits (LSBs). In general, the coarse and fine parts of a time stamp are generated using two different techniques. The MSBs are obtained by counting the number of elapsed clock cycles between a reference instant and the event to be measured, and the LSBs are generated by dividing the clock period in smaller time intervals and identifying in which smaller time interval the event has happened. In an actual implementation, the MSBs can be generated by adopting a $N_{MBS}$-bit binary counter circuit running at the frequency $f_{clk}$. The LSB part is typically generated by using a delay locked loop (DLL) circuit operating at frequency $f_{clk}$. The DLL generates $2^{NLSB}$ equally spaced clock phases. At the instant in which the event to be measured occurs, the DLL phases are sampled and stored in a $2^{NLSB}$-bit register. The word in the register is then decoded using thermometer-to-binary decoding to provide an $n_{LSB}$-bit word corresponding to the binary representation of the fine time stamp. The fine time stamp identifies the DLL phase, to within one clock period, in which the event occurred. In the case of a multi-channel system, only single DLL is required. The sampling and decoding of the DLL phases instead has to be performed in each channel independently.

Ideally, there should be no phase difference between the coarse counter clock and the clock used by the DLL, but in practice, there is always a skew between the clock of the coarse counter and that of the DLL. This is inherent in any implementation on silicon. This is because signal propagation delays can become comparable with the DLL resolution.

U.S. Pat. No. 5,166,959 describes a time-to-digital converter (TDC) implementation in which two coarse counters clocked with two clocks in opposition of phase (lead and lag clocks) and a DLL. The two counters lead and lag the clock used by the DLL. The DLL clock is skewed by ¼ of the clock period with respect to the lead/lag clocks. When an event occurs, both lead and lag counters are sampled, but only one of them is stored. The first phase produced by the DLL determines which coarse time stamp is to be stored. The alignment between coarse and fine time stamps is guaranteed by choosing the correct time stamps among those produced by the two coarse counters. The alignment between the coarse part and fine part of the time stamp is guaranteed only when the skew between the coarse part and fine part of the DLL clocks does not exceed ±4 LSBs. When this implementation is used in a multi-channel system, it does not provide consistent time stamps for events occurring simultaneously in more than one channel. If the coarse and fine clocks present different skews in different channels, different time stamps are generated for events occurring at the same instant in different channels. The skew between the coarse and fine clock has to stay within ±¼ of the coarse clock period.

In WO-A-2007/093221, the TDC implementation is based on a ring oscillator, for example, a closed loop delay line, or on a combination of Vernier delay lines, for example, an open loop delay line. A calibration technique is used to guarantee linearity at the boundaries between fine and coarse time stamps in which two reference clock edges are injected into the Vernier delay line after every measured pulse. By sampling the status of the Vernier delay line at the two calibration edges, the actual position of the coarse clock edges with respect to the ideal position is measured and used to correct the final fine time stamp. The final time stamp is obtained by multiplying the measured fine time stamp by the correction.

In U.S. Pat. No. 5,838,754, the TDC implementation adopts a Vernier delay line to generate fine time stamps. When combined with a coarse counter, the misalignment between coarse and fine time stamps is prevented by having the coarse counter count both edges of the clock signal in order to provide a redundant bit between the coarse and fine time stamps. If the redundant bit is not equal, than the coarse time stamp is corrected before combining it with the fine time stamp. The alignment is guaranteed only if the skew between the coarse and fine clocks does not exceed ±¼ of the coarse clock period. When used in a multi-channel system, events occurring simultaneously in more than one channel do not have the same time stamp. Indeed, if the coarse and fine clocks present different skews in different channels, different time stamps are generated for events occurring at the same instant in different channels.

If offset correction is not been carried out using the correct offset value, the impact on the final time stamp produces an error known as rollover.

SUMMARY OF CERTAIN INVENTIVE ASPECTS

Certain inventive aspects relate to an improved time stamp generation implementation that minimizes errors due to offset uncertainty.

Certain inventive aspects relate to time stamp generation that can be implemented in a multi-channel system.

In accordance with a first inventive aspect, there is provided a time-to-digital conversion circuit for providing a digital output indicative of the time at which an event occurred. The conversion circuit includes a) a clock for generating a first clock signal having a clock period, b) a coarse timing circuit for counting the number of elapsed clock periods from a reference point in time to the detection of the event to be measured, the coarse timing circuit generating a coarse count corresponding to the most significant bits of the digital output, c) a time division circuit for dividing the clock period into smaller sub-intervals by generating a plurality of second clock signals, each second clock signal being a copy of the first clock signal and each copy being phase delayed with respect to the first clock signal, the number of copies equaling the number of sub-intervals, d) a fine timing circuit for determining in which sub-interval of the clock period the event occurred, the fine timing circuit generating the least significant bits of the digital output, and e) a correction circuit for correcting an erroneous offset between the first and second clock signals in the fine timing circuit, wherein the correction circuit further comprises a synch circuit for determining in which half of the clock period the event occurred to correct for the erroneous offset in the fine timing circuit.

By correcting the erroneous offset, the problem associated with rollover is solved. In particular, by knowing, for each event, in which half of the clock period it occurred, this information can be used to correct the erroneous offset applied in the time stamp. The LSB values after offset subtraction can be corrected by considering the status of the signal bit_half indicating the time occurrence of the event to which the time stamp is to be applied with respect to the clock period.

Advantageously, the synch circuit determines a bit_half flag that identifies the half of the clock period in which the event occurred.

It is preferred that the time division circuitry comprises a decoder module, and the synch circuit generates a signal for the decoder module when the least significant bit needs to be sampled.

The correction circuit may further comprise a calibration circuit for determining a time offset value between the first clock signal and one of the second clock signals in each calibration phase, the calibration circuit storing the time offset value for subsequent use with all subsequent events until the next calibration phase.

A delay locked loop may be used for dividing the fine clock in sub-intervals for the determination of LSB. Alternatively, a delay line may be used.

In accordance with a second inventive aspect, there is provided a method for correcting for an erroneous offset in a digital output generated by a time-to-digital conversion circuit. The method includes a) generating a first clock signal having a clock period, b) counting the number of elapsed clock periods from a reference point in time to the detection of an event to be measured, c) generating a coarse count from the number of elapsed clocked periods, d) dividing each clock period into smaller sub-intervals, e) generating a plurality of second clock signals, each second clock signal being a copy of the first clock signal and each copy being phase delayed with respect to the first clock signal, the number of copies equaling the number of sub-intervals, f) determining in which sub-interval the event occurred using one of the plurality of second clock signals, g) generating the least significant bits of the digital output in accordance with an offset between the first clock signal and one of the plurality of second clock signals, and h) correcting for an erroneous offset between the first clock signal and second clock signals, wherein process h) comprises determining in which half of the first clock period the event occurred to correct for the erroneous offset.

Process h) may comprise subtracting the offset from the least significant bits and applying a correction in accordance with a flag indicating the half of the first clock period in which the event occurred.

BRIEF DESCRIPTION OF THE DRAWINGS

For a better understanding of the present disclosure, reference will now be made, by way of example only, to the accompanying drawings in which:—

DETAILED DESCRIPTION OF CERTAIN ILLUSTRATIVE EMBODIMENTS

Figure 1:
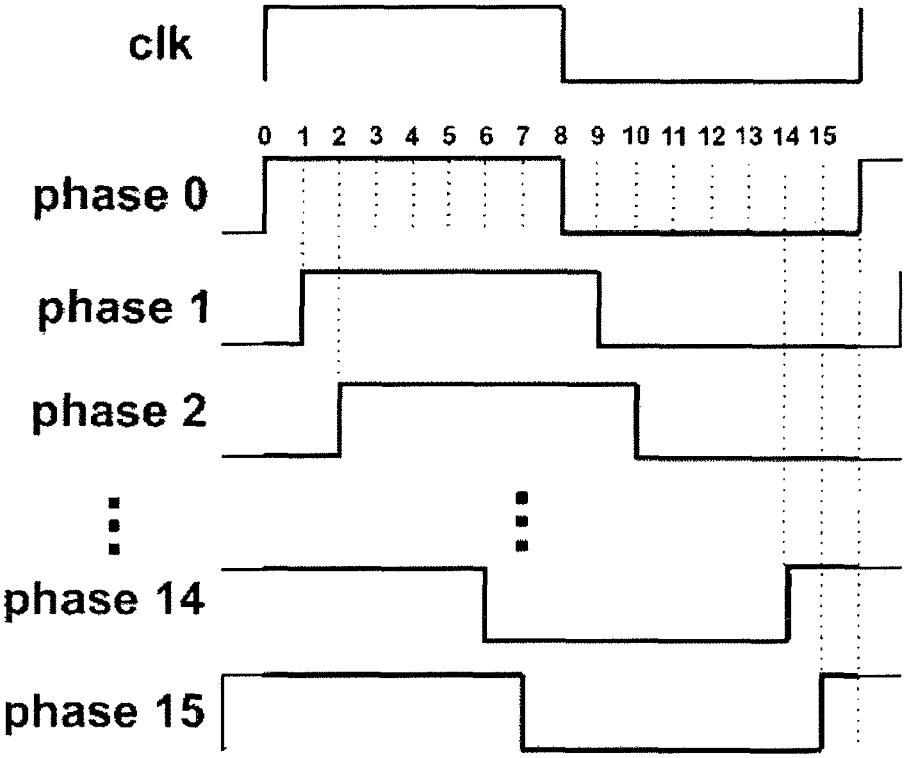
FIG. 1 illustrates a clock signal together with clock phases generated by a DLL.

The present disclosure will be described with respect to particular embodiments and with reference to certain drawings but the disclosure is not limited thereto. The drawings described are only schematic and are non-limiting. In the drawings, the size of some of the elements may be exaggerated and not drawn on scale for illustrative purposes.

A TDC is an electronic system clocked at frequency $f_{clk}$ that produces a digital word or time stamp that corresponds to events that occur in time. The time stamp comprises two parts: the MSB (or coarse) part with $N_{MSB}$ bits and the LSB (or fine) part with $N_{LSB}$ bits. One embodiment introduces a technique that guarantees the alignment between the LSB (least significant bit) and MSB (most significant bit) parts of the time stamps generated by the TDC.

In certain embodiments, a 160 MHz clock is used to generate the clock periods that are counted to determine the MSB count. Such a clock has a clock period of 6.25 ns and therefore a resolution of 6.25 ns. For the LSB count, the clock period of 6.25 ns is divided by 16 to provide a fine resolution of 390.625 ps.

It will be appreciated that these values are given by way of example, and that other suitable clock periods may be chosen. In addition, the clock period may be divided into a different number of sub-intervals to 16 in accordance with the DLL used for generating such sub-intervals.

To achieve the correct fine stamp, the time offset needs to be subtracted from the value of the fine time stamp. One point calibration (subtraction of offset) cannot be applied due to the uncertainty on the value of the measured offset. This is illustrated in Table 1 below.

TABLE 1

| IDEAL | | | ACTUAL (11τ skew) | | | 11τ CORRECTED | | | 12τ CORRECTED | | |
|---|---|---|---|---|---|---|---|---|---|---|---|
| MSB | LSBs | Dec | MSB | LSBs | Dec | MSB | LSBs | Dec | MSB | LSBs | Dec |
| . . . 0 | 0000 | 0 | . . . 0 | 1001 | 11 | . . . 0 | 0000 | 0 | . . . 0 | 1111 | 15 |
| . . . 0 | 0001 | 1 | . . . 0 | 1010 | 12 | . . . 0 | 0001 | 1 | . . . 0 | 0000 | 0 |
| . . . 0 | 0010 | 2 | . . . 0 | 1011 | 13 | . . . 0 | 0010 | 2 | . . . 0 | 0001 | 1 |
| . . . 0 | 0011 | 3 | . . . 0 | 1110 | 14 | . . . 0 | 0011 | 3 | . . . 0 | 0010 | 2 |
| . . . 0 | 0100 | 4 | . . . 0 | 1111 | 15 | . . . 0 | 0100 | 4 | . . . 0 | 0011 | 3 |
| . . . 0 | 0101 | 5 | . . . 0 | 0000 | 0 | . . . 0 | 0101 | 5 | . . . 0 | 0100 | 4 |
| . . . 0 | 0110 | 6 | . . . 0 | 0001 | 1 | . . . 0 | 0110 | 6 | . . . 0 | 0101 | 5 |
| . . . 0 | 0111 | 7 | . . . 0 | 0010 | 2 | . . . 0 | 0111 | 7 | . . . 0 | 0110 | 6 |
| . . . 0 | 1000 | 8 | . . . 0 | 0011 | 3 | . . . 0 | 1000 | 8 | . . . 0 | 0111 | 7 |
| . . . 0 | 1001 | 9 | . . . 0 | 0100 | 4 | . . . 0 | 1001 | 9 | . . . 0 | 1000 | 8 |
| . . . 0 | 1010 | 10 | . . . 0 | 0101 | 5 | . . . 0 | 1010 | 10 | . . . 0 | 1001 | 9 |
| . . . 0 | 1001 | 11 | . . . 0 | 0110 | 6 | . . . 0 | 1001 | 11 | . . . 0 | 1010 | 10 |
| . . . 0 | 1010 | 12 | . . . 0 | 0111 | 7 | . . . 0 | 1010 | 12 | . . . 0 | 1001 | 11 |
| . . . 0 | 1011 | 13 | . . . 0 | 1000 | 8 | . . . 0 | 1011 | 13 | . . . 0 | 1010 | 12 |
| . . . 0 | 1110 | 14 | . . . 0 | 1001 | 9 | . . . 0 | 1110 | 14 | . . . 0 | 1011 | 13 |
| . . . 0 | 1111 | 15 | . . . 0 | 1010 | 10 | . . . 0 | 1111 | 15 | . . . 0 | 1110 | 14 |
| . . . 1 | 0000 | 16 | . . . 1 | 1001 | 27 | . . . 1 | 0000 | 16 | . . . 1 | 1111 | 31 |
| . . . 1 | 0001 | 17 | . . . 1 | 1010 | 28 | . . . 1 | 0001 | 17 | . . . 1 | 0000 | 16 |
| . . . 1 | 0010 | 18 | . . . 1 | 1011 | 29 | . . . 1 | 0010 | 18 | . . . 1 | 0001 | 17 |
| . . . 1 | 0011 | 19 | . . . 1 | 1110 | 30 | . . . 1 | 0011 | 19 | . . . 1 | 0010 | 18 |
| . . . 1 | 0100 | 20 | . . . 1 | 1111 | 31 | . . . 1 | 0100 | 20 | . . . 1 | 0011 | 19 |
| . . . 1 | 0101 | 21 | . . . 1 | 0000 | 16 | . . . 1 | 0101 | 21 | . . . 1 | 0100 | 20 |
| . . . 1 | 0110 | 22 | . . . 1 | 0001 | 17 | . . . 1 | 0110 | 22 | . . . 1 | 0101 | 21 |
| . . . 1 | 0111 | 23 | . . . 1 | 0010 | 18 | . . . 1 | 0111 | 23 | . . . 1 | 0110 | 22 |
| . . . 1 | 1000 | 24 | . . . 1 | 0011 | 19 | . . . 1 | 1000 | 24 | . . . 1 | 0111 | 23 |
| . . . 1 | 1001 | 25 | . . . 1 | 0100 | 20 | . . . 1 | 1001 | 25 | . . . 1 | 1000 | 24 |
| . . . 1 | 1010 | 26 | . . . 1 | 0101 | 21 | . . . 1 | 1010 | 26 | . . . 1 | 1001 | 25 |
| . . . 1 | 1001 | 27 | . . . 1 | 0110 | 22 | . . . 1 | 1001 | 27 | . . . 1 | 1010 | 26 |
| . . . 1 | 1010 | 28 | . . . 1 | 0111 | 23 | . . . 1 | 1010 | 28 | . . . 1 | 1001 | 27 |
| . . . 1 | 1011 | 29 | . . . 1 | 1000 | 24 | . . . 1 | 1011 | 29 | . . . 1 | 1010 | 28 |
| . . . 1 | 1110 | 30 | . . . 1 | 1001 | 25 | . . . 1 | 1110 | 30 | . . . 1 | 1011 | 29 |
| . . . 1 | 1111 | 31 | . . . 1 | 1010 | 26 | . . . 1 | 1111 | 31 | . . . 1 | 1110 | 30 |

In Table 1, an example illustrated how the time offset impacts the time stamp value is shown for an ideal situation, an actual situation where the offset is 11τ, a corrected situation where the 11τ offset has been corrected, and a corrected situation where the offset correction applied is 12τ to an actual offset of 11τ. The ideal situation is shown in the first three columns, the actual offset of 11τ is shown in the next three columns, the correction for an offset of 11τ is shown in the next three columns, and the correction for 12τ is shown in the last three columns. It can clearly be seen that if the incorrect offset correction is applied, a large error may be obtained. In the illustrated example, an error of 15 LSB is obtained as indicated in bold in the right hand column of Table 1.

Turning now to FIG. 1, an ideal situation is shown where there is no phase difference between the coarse counter clock and the clock used by the DLL of the prior art for a 4-LSB fine time stamp ($\tau=T_{clk}/2^4$). The phase relation between the clock and the phase generated by the DLL is shown. The relative phase between the two clocks is always constant as both clocks are generated by the same master clock. As a consequence the phase 0 of the DLL is at the beginning of the clock period and phase 15 is at the end of the clock period.

Figure 2:
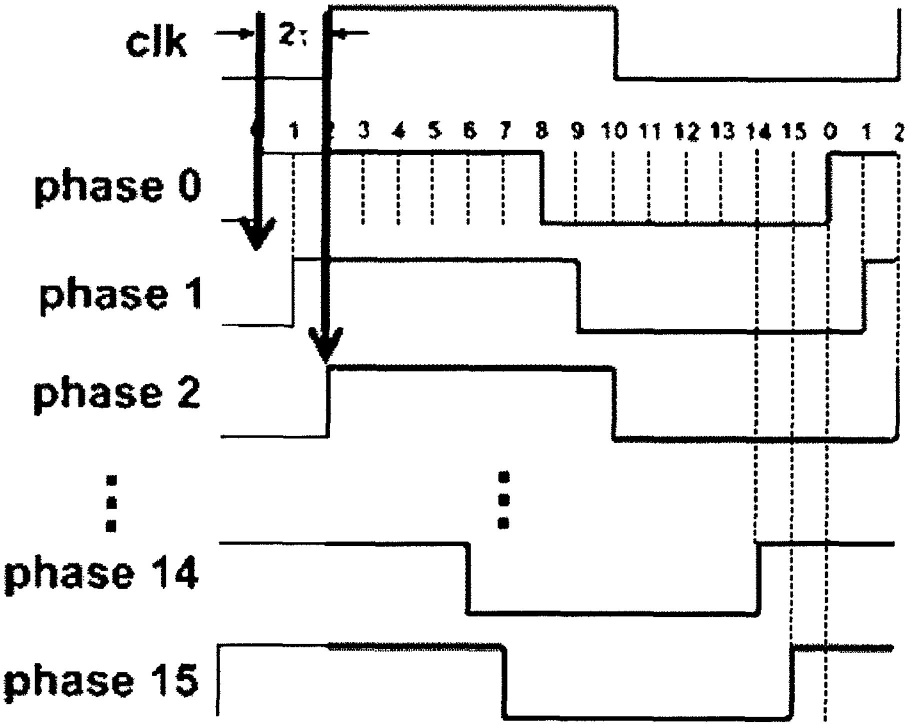
FIG. 2 illustrates an example of a skew between the coarse counter clock and the DLL clock for an offset of 2τ.

FIG. 2 illustrates the situation where the clock of the DLL is delayed by 2τ with respect to the coarse counter clock. Here, phase 2 occurs at the beginning of the clock period, while phase 1 occurs at the end of the clock period. The offset of the DLL phases translates in an incorrect fine time stamp value. In order to obtain the correct fine stamp (LSBs), the time offset has to be subtracted from the fine time stamp value.

However, there is always uncertainty on the value of the measured offset. In the case, in which the time offset is affected by an error, the complete time stamp is going to be affected by an error $e_{off}$.

Figure 3:
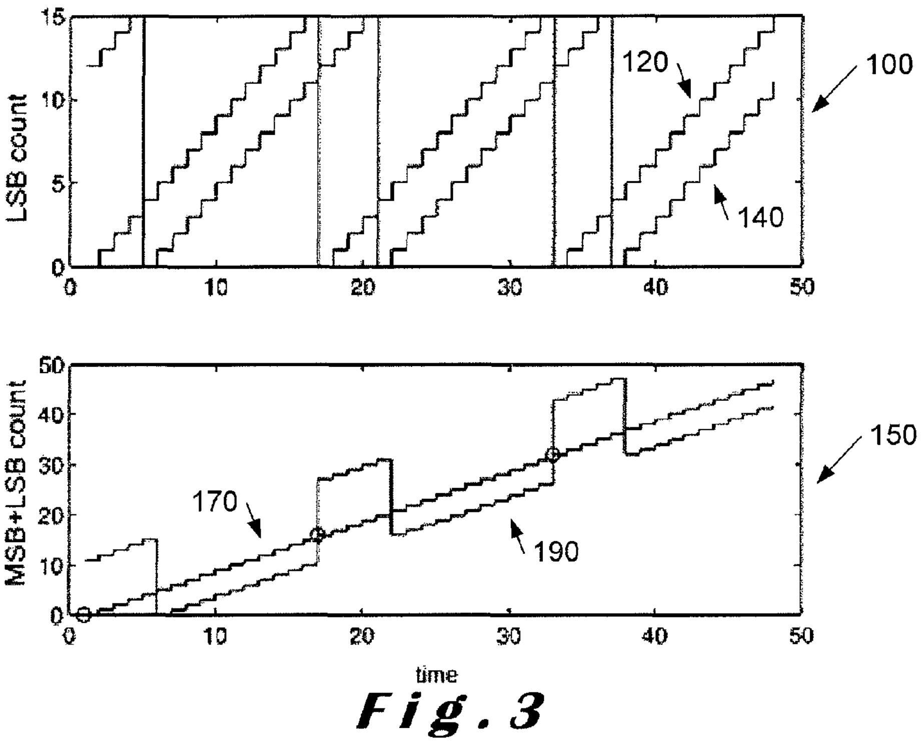
FIG. 3 illustrates plots of an LSB count and a complete count with and without a time offset of 11τ.

In the case with a time offset of 11τ as shown in FIG. 3, if this offset is subtracted from the LSB time stamp, the complete (MSB+LSB) time stamp corresponds to that of the ideal case. Here, plot 100 illustrates the LSB count. Line 120 illustrates the ideal situation with no offset and line 140 illustrates the case where the offset is 11τ. Plot 150 illustrates the impact of the offset on the final time stamp, that is, MSB+LSB count. Here, the ideal situation and the situation where the correction has been correctly applied for an offset of 11τ is shown by line 170. Line 190 shows the situation where no correction has been applied for the 11τ offset. In the case where the time offset is affected by an error, the complete time stamp is affected by an error $e_{off}$ as shown in FIG. 4.

In an ideal situation, the clock for the coarse counter providing the MSB count would be aligned with the sub-intervals generated by the DLL to provide the LSB count. However, in practice, this rarely occurs and an offset between the two clocks exists. This offset can be measured in terms of the sub-intervals and subtracted digitally to provide the difference in alignment.

Figure 4:
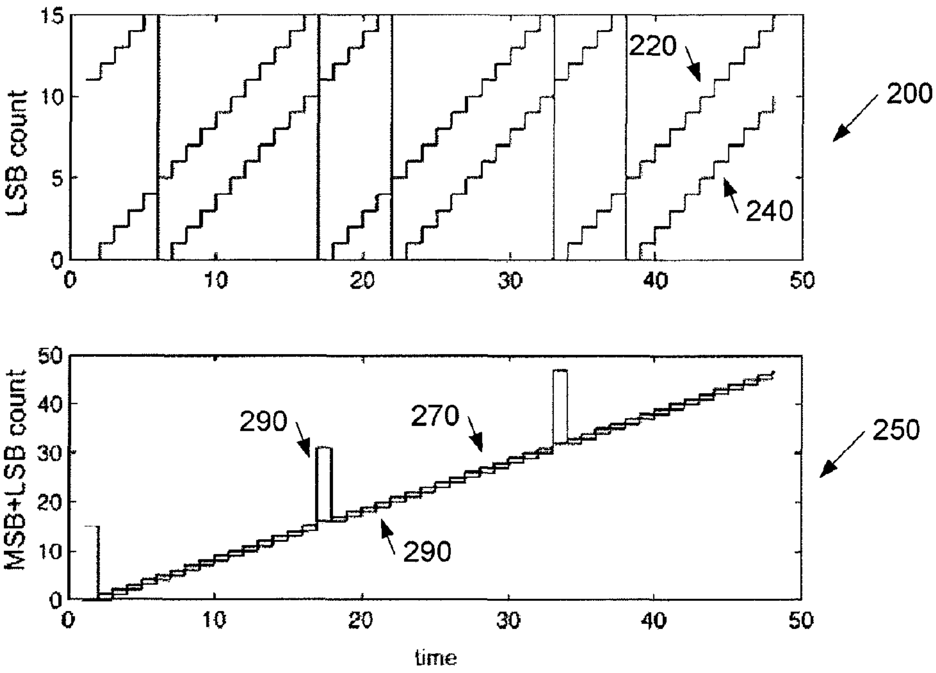
FIG. 4 illustrates plots of an LSB count and a complete count with LSB correction with a wrong time offset, the correction being made for an offset of 12τinstead for an actual offset of 11τ.

In FIG. 4, plot 200 illustrates the LSB count and line 220 shows the ideal situation. Line 240 shows the situation with an offset of 11τ. Plot 250 illustrates the impact of the offset on the final time stamp, that is, MSB+LSB count where the offset correction has been performed with an incorrect value of 12τ. This error is known as rollover issue.

The rollover issue can be solved by knowing, for each event, in which half of the clock period it occurred. This information can be used to correct the fine time stamp. The LSB values after offset subtraction can be corrected by considering the status of the signal bit_half indicating the position of the time stamp with respect to the clock period. In the ideal case, when bit_half=1 the LSB count varies between 0 and $2^{NLSB/2}-1$ (0 and 7 in the example), while when bit_h-alf=0 the LSB count varies between $2^{NLSB/2}$ and $2^{NLSB}-1$ (8 and 15 in the example). As a consequence, if the wrong bit_half is associated to the LSB count, the new LSB count can be obtained by subtracting the old LSB count from $2^{NLSB}-1$ (15 in the example). In summary, the correction algorithm using bit_half can be expressed as follows:

```
if ((LSB_count>2^(NLSB/2)-1) AND (bit_half=1)) OR
((LSB_count<2^(NLSB/2)) AND (bit_half=0))
thenLSB_count=2^(NLSB)-1 -LSB_count
else LSB_count=LSB_count.
```

Figure 5:
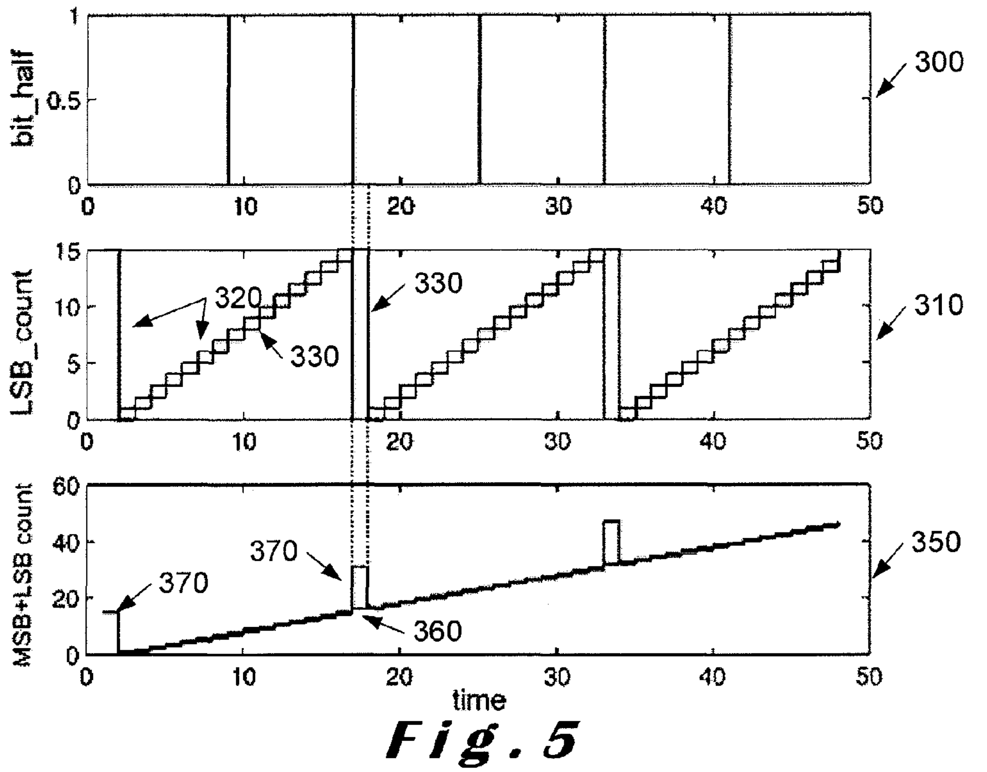
FIG. 5 illustrates plots of a bit_half flag value an LSB count and a complete count for identifying the condition for which the LSB count is incorrect, the correction being made for an offset of 12τ instead for an actual offset of 11τ.

FIG. 5 shows that, in the example where an actual offset of 11τ is present and an incorrect correction of 12τ is applied, the error on the complete time stamp occurs when the LSB count is larger than 7 (for a clock period division into 16) and the corresponding value of bit_half is equal to 1, that is, in the first half of the clock period. Here, plot 300 illustrates the bit_half, plot 310 illustrates the LSB count and plot 350 illustrates the complete time stamp, MSB+LSB count. In plot 310, the ideal situation is indicated by line 320 and the corrected situation for an offset of 12τ is indicated by line 330. As shown, the two lines 320 and 330 do not coincide at any point. In plot 350, line 360 indicates the ideal situation and line 370 illustrates the correction for an offset of 12τ.

In a similar way, not shown, an error also occurs if the LSB count is less than 7 and the bit_half count is equal to 0, that is, is in the second half of the clock period.

Figure 6:
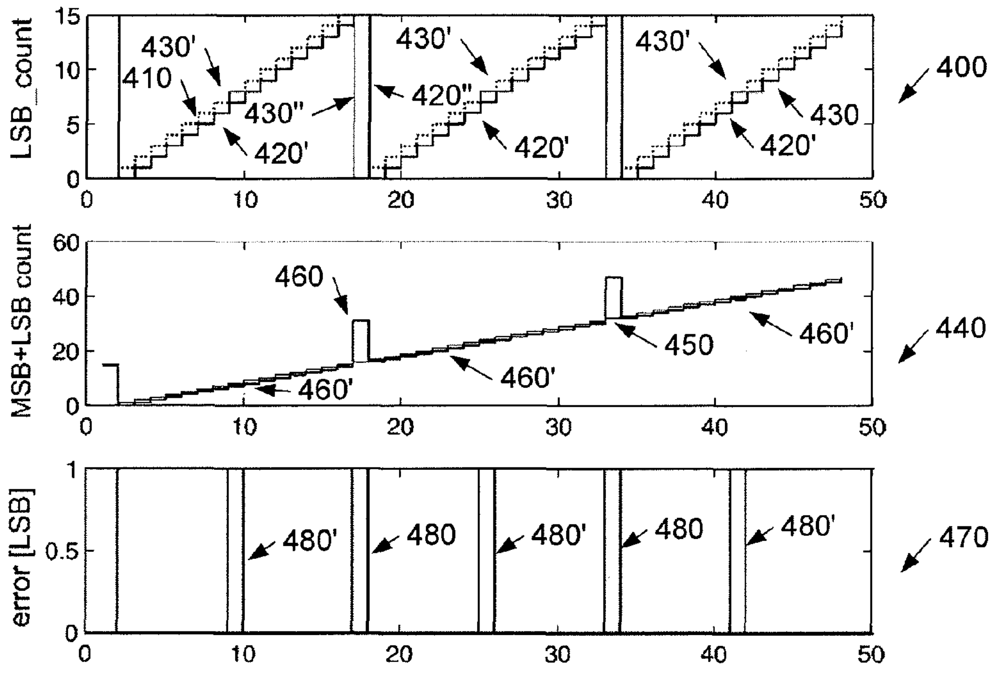
FIG. 6 illustrates plots of an LSB count, a complete count and LSB error with a correction being made for an offset of 12τ instead for an actual offset of 11τ.

FIG. 6 shows the LSB and complete time stamps when the correction has using the correction algorithm. In plot 400, the ideal situation is indicated by the upper line 410. Whilst the actual time offset is 11τ as before, the correction adopts an offset of 12τ. This is indicated by line 420. Line 430 illustrates the situation where a correction for an offset of 12τ has been applied and corrected using the correction algorithm. Lines 420 and 430 substantially overlap except for the horizontal portions indicated 420' and 430' and the vertical portions 420" and 430". Portions 420' and 420" correspond to where the correction for an offset of 12τ has been made and portions 430' and 430" correspond to where the correction for an offset of 12τ has been applied followed by the correction algorithm.

As shown in plot 440 in FIG. 6, line 450 corresponds to both the ideal situation and the correction for an offset of 12τ followed by the correction algorithm. Line 460 corresponds to the situation where only the correction for an offset of 12τ has been applied. Portions corresponding horizontal portions 420' are indicated by lines 460'. Plot 470 illustrates error in the LSB. As shown, error positions 480 correspond to error jumps in line 460 in plot 440 and error positions 480' correspond to the positions of lines 460' in plot 440.

In FIG. 6, the error of the time stamp with respect to the ideal case is shown, the error being evaluated as the absolute value of the difference between the time stamp obtained after offset and algorithm corrections and the ideal time stamps. In general, the maximum error is equal to the error that affects the offset $|e_{off}|$.

Figure 7:
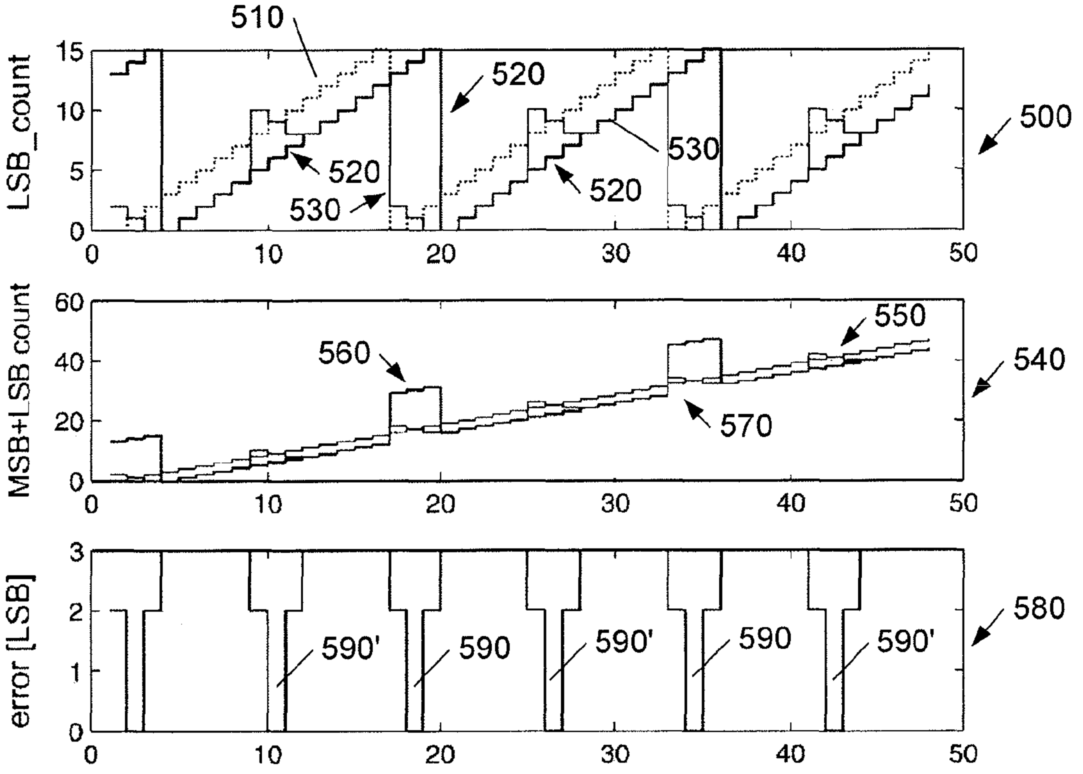
FIG. 7 is similar to FIG. 6 but with a correction for an offset of 14τinstead for an actual offset of 11τ.

FIG. 7 shows another case in which the calibration of the time offset is done with a value affected by 3 LSBs error, that is, an offset of 14τ is used instead of 11τ. The maximum error in the complete time stamp is equal to $e_{off}$=3 LSBs. In plot 500, the ideal situation is shown by line 510, the situation where correction has been made for an offset of 14τ is shown by line 520 and the situation where correction has been made for 14τ followed by the correction algorithm is shown by line 530. In plot 540, lines 510, 520, 530 correspond respectively to line 550, 560, 570. The three lines 550, 560, 570 substantially overlap except for the error jumps created by the correction for an offset of 14τ instead of for an offset of 11τ. Plot 580 shows the error as indicated by positions 590, 590'. Positions 590 correspond to where the error jumps occur in the correction for offset at 14τ as indicated by line 560 in plot 540 and positions 590' correspond to regions where the correction for an offset of 14τ and the correction algorithm deviate from the line 530 in plot 500.

Figure 8:
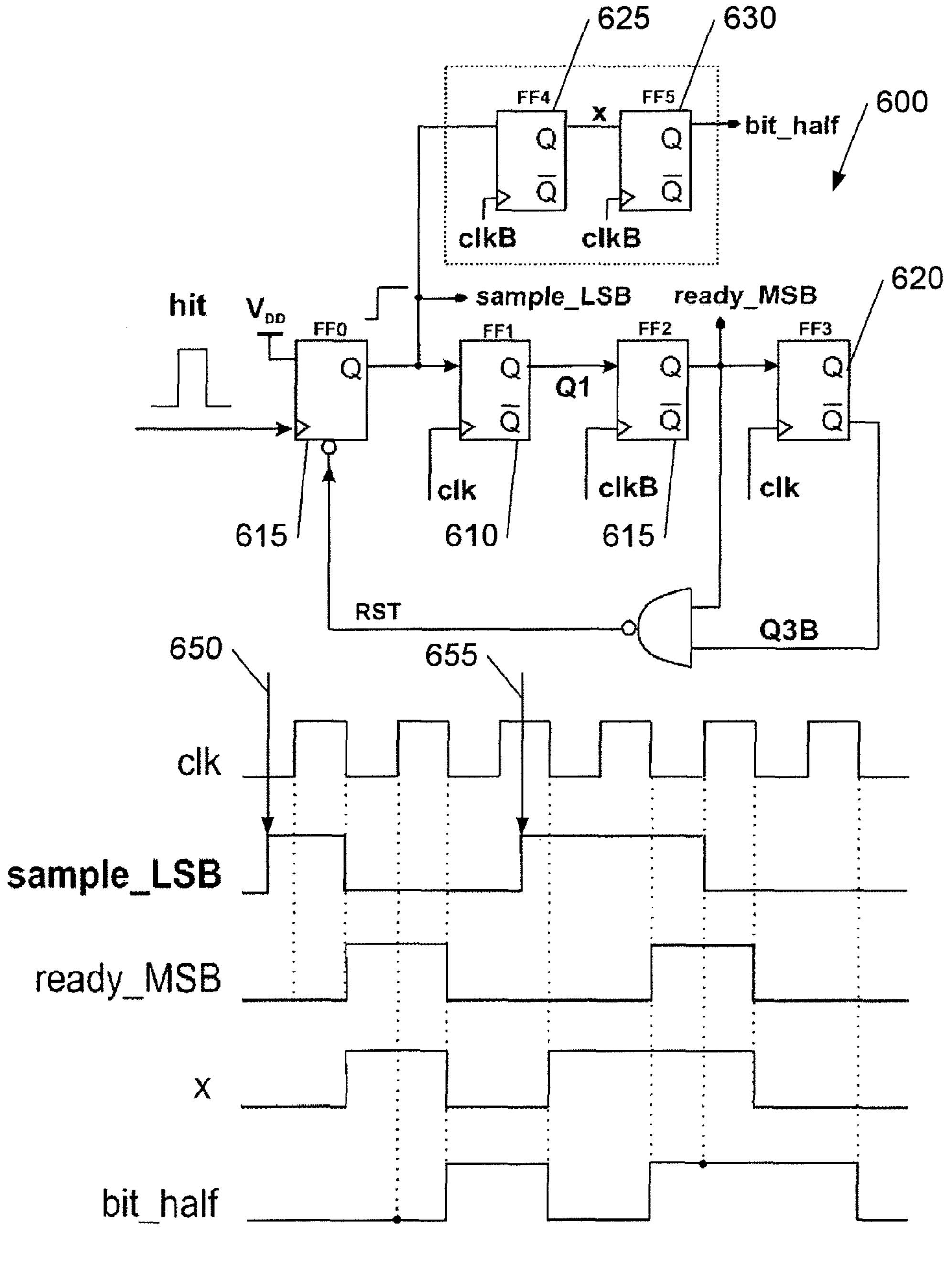
FIG. 8 illustrates a schematic architecture for generating a sampling signal together with clock signals produced.

FIG. 8 illustrates a synch block circuit 600 together with the clock signals obtained from the circuit 600. The synch block circuit 600 comprises flip-flop elements 605, 610, 615, 620 connected in series as shown. The Q or non-inverting outputs from the first, second and third flip-flop elements 605, 610, 615 each forms an input for the next flip-flop element 610, 615, 620 respectively. A LSB is sampled from the output from the first flip-flop element 605. This output also forms the input to a fifth flip-flop element 625 that is connected to a sixth flip-flop element 630. The output from the sixth flip-flop element 630 provides the bit_half information.

The synch block circuit 600 is used to identify when to sample the coarse counter of the TDC (synch block). A synchronization block is used to generate the sampling signal for the fine time stamp and the flag indicating when to read the coarse time stamp. In the timing diagram, arrow 650, 655 indicate when events occur. The first half of the time periods in which the 'ready_MSB' signal goes high correspond to blind zones in which events cannot be detected. The signal 'bit_half' is generated by flip-flop elements 625, 630 clocked on the falling edge. The clock signal 'clkB' has opposite phase with respect to clock signal 'clk'.

The signal 'bit_half' can be affected by an error. The error can be minimized by certifying that it only occurs in correspondence of the falling edge of the clock by using the circuit shown in FIG. 8. The signal 'bit_half' identifies whether the event occurred before or after the falling edge of the clock signal. The value of bit_half is sampled in correspondence of the rising edge identified by the signal 'ready_MSB' which also identifies when to sample the value of the coarse counter.

A potential time stamp uncertainty that corresponds to the rising edge can only occur if flip-flop element 605 misses an event because the event occurs just before the rising edge, that is, at the end of cycle N. In this case, bit_half=1, corresponding to the falling edge, flip-flop element 625 correctly samples the signal 'sample_LSB', that is, the event belongs to the first part of period, and the fine time stamp, after subtraction of the offset, is 15. Since flip-flop 605 misses the event, the event becomes associated to the next clock period, N+1. As a consequence, the correction algorithm corrects the fine time stamp as it has a value higher than 7 and its bit_half value is 1. After correction, the final fine time stamp is 0. Therefore, the error on the total time stamp is 1 LSB as the event is associated with cycle N+1 instead of cycle N.

If there is an error in the value of bit_half around the falling edge of the clock, ideally bit_half should be equal to 1 for fine time stamps in the first half of the period and equal to 0 for the fine time stamps in the second half of the period. $e_{hb}$ is the error in the position of the transition of bit_half from the region where bit_half=1 and the region where bit_half=0 with respect to the ideal case (half period). The value of $e_{hb}$ depends on the duty cycle of the clock.

Figure 9:
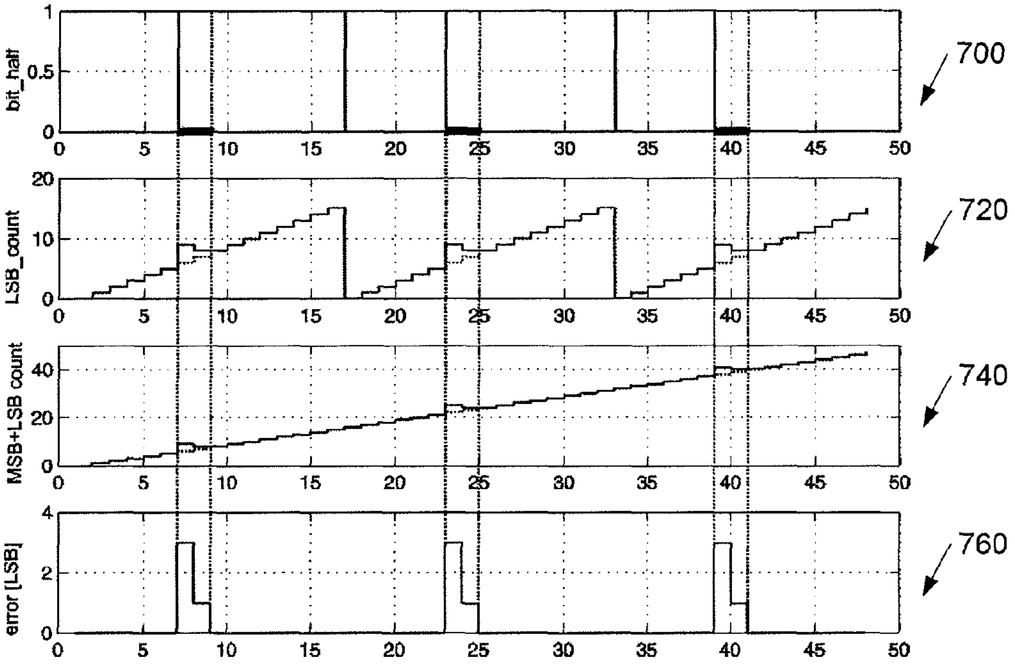
FIG. 9 illustrates plots of bit_half, LSB count, a complete count and LSB error that show the impact of the evaluation error of the bit_half on the complete time stamp.

In FIG. 9, the case in which $e_{off}$=0 and $e_{hb}$=2 is shown. Plots 700, 720, 740 and 760 correspond respectively to bit-half, LSB count, the complete time stamp (MSB+LSB) and the LSB error. As shown, the errors in plot 760 correspond to discontinuities in the other plots 700, 720, 740. The complete time stamp is affected by a maximum error equal to $2|e_{hb}|-1=3$ LSB.

Figure 10:
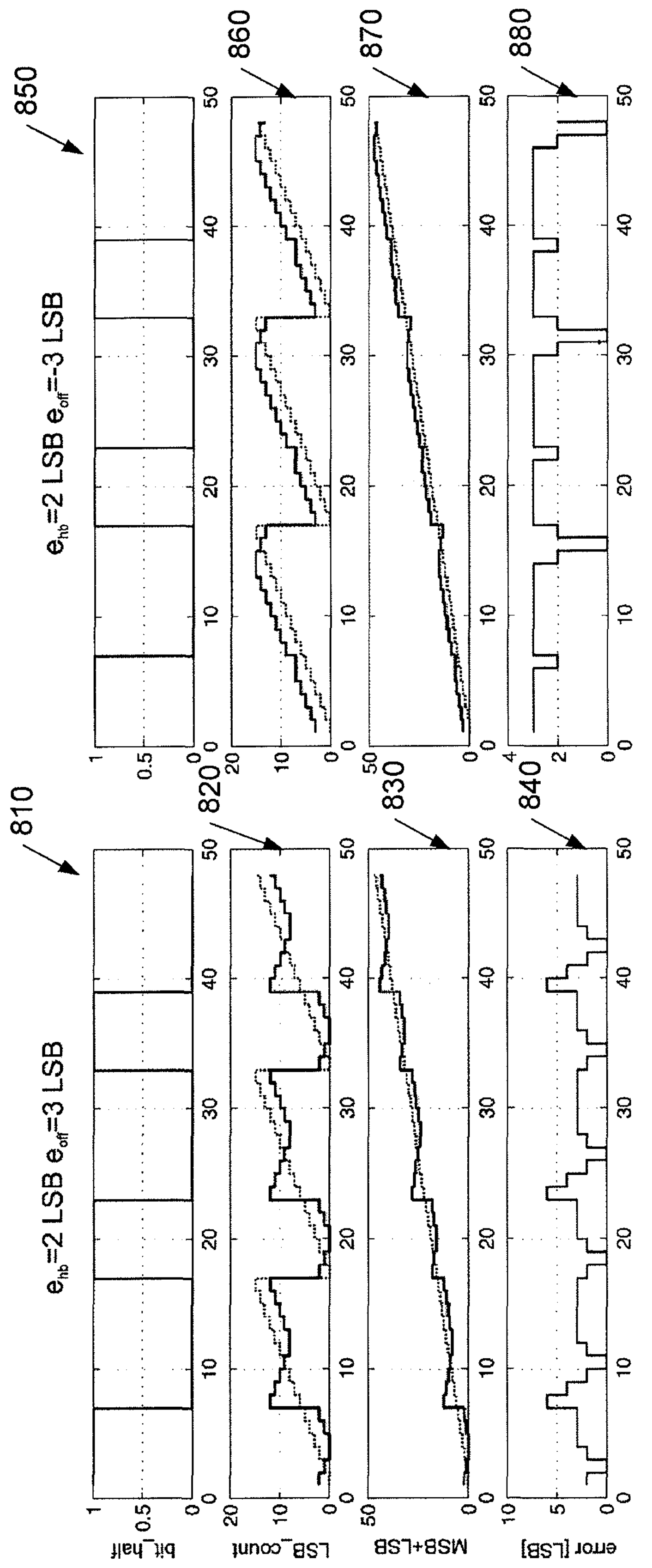
FIG. 10 illustrates plots bit_half, LSB count, a complete count and LSB error that show the impact of the sign of the errors on the complete time stamps.

Therefore, the total maximum error $e_{tot\_max}$ that affects the complete time stamp is equal to $e_{tot\_max}=|e_{off}|+2|e_{hb}|-1$. It should be noted that $e_{off}$ and $e_{hb}$ can also compensate each other depending on their respective signs. FIG. 10 illustrates the impact of sign on the errors.

In FIG. 10, $e_{hb}=2$ LSB and $e_{off}=\pm3$ LSB are shown. Plots 810, 820, 830, 840 illustrate $e_{hb}=2$ LSB and plots 850, 860, 870, 880 illustrate $e_{off}=\pm3$ LSB. As before, plots 810, 850 illustrate the bit_half, plots 820, 860 illustrate the LSB count, plots 830, 870 illustrate the combine MSB+LSB count, and plots 840, 880 illustrate the LSB error. The impact of the sign of the errors on the complete time stamps is shown when the original algorithm is applied.

The total maximum error can be reduced to $|e_{off}|$ if the correction algorithm is modified so that it checks only in the 4 LSB-wide regions close to the beginning and the end of the clock period neglecting what occurs around the falling edge. In this case, the modified algorithm becomes (in the case of 4-bit fine time stamp):

```
if ((LSB_count>11) AND (bit_half=1)) OR ((LSB_count<4)
AND (bit_half=0))
then LSB_count=15−LSB_count
else LSB_count=LSB_count.
```

This algorithm is effective as far as $|e_{hb}|<4$ LSB and $|e_{off}|<4$ LSB.

Figure 11:
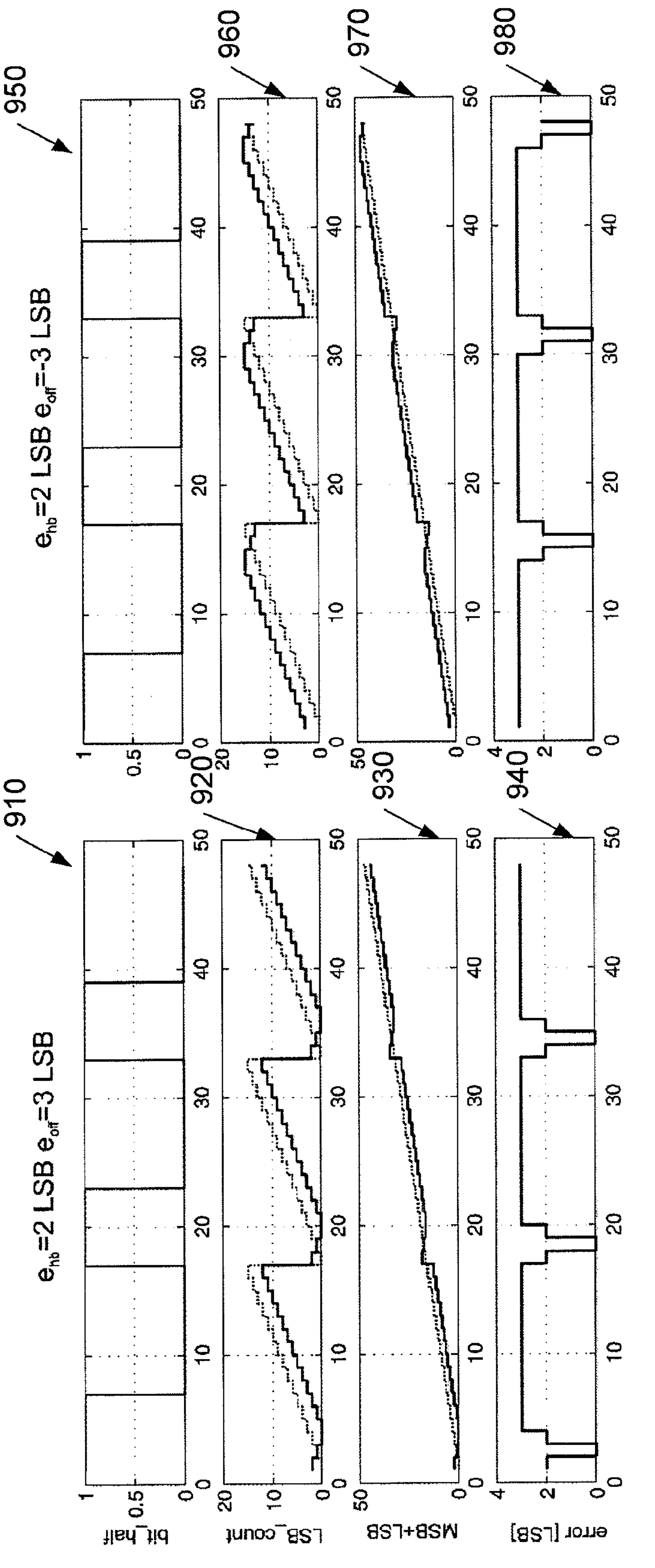
FIG. 11 is similar to FIG. 10 but illustrates the impact of errors on time stamps with correction in accordance with one embodiment.

FIG. 11 illustrates the impact, namely, of errors on time stamps, of the modified algorithm in the same situations as shown in FIG. 10. When the modified algorithm is used, the error around the falling edge stays constant and equal to $|e_{off}|$. Plots 910, 920, 930, 940, 950, 960, 970, 980 correspond to respect ones of plots 810, 820, 830, 840, 850, 860, 870, 880 shown in FIG. 10.

The calibration procedure as well as the correction algorithm can be implemented in a multi-channel system in a way that is completely transparent to the user. The calibration corrects the time offset in each channel and makes sure that the time stamps are consistent between all the channels, and is also valid for any delay. The correction algorithm is also applied in order to minimize the error that affects the time stamps as a consequence of the error on the calibration offset.

Figure 12:
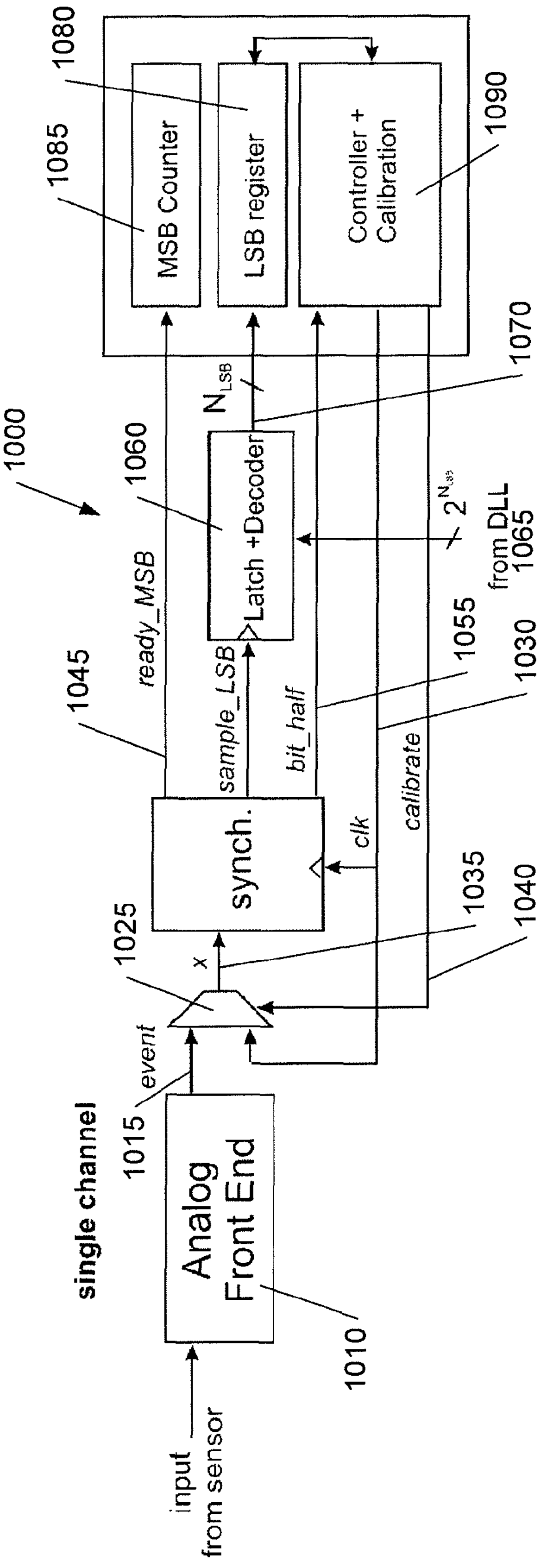
FIG. 12 illustrates a block diagram of an implementation of one embodiment for one channel.

FIG. 12 shows an implementation 1000 for a 4-LSB time stamp in a single channel. The implementation 1000 comprises an analogue front-end (AFE) 1010 which generates a digital event signal 1015. This digital event signal 1015 triggers the sampling of the fine time stamp, sample_LSB, through the synch block 1020. The synch block 1020 also generates the flag, ready_MSB, that communicates to the digital part when to sample the coarse counter. Sampling of the coarse counter is carried out inside the digital part. The synch block 1020 has been described with reference to FIG. 8 above.

A multiplexer 1025 is provided in front of the synch block 1020 between the AFE 1010 and the synch block 1020 itself. The multiplexer 1025 selects between the digital event signal 1015 and a clk signal 1030 and provides an output signal 1035 that forms the input to the synch block 1020. This selection is used to ensure that input pulses are synchronous with the clock itself. A 'calibrate' signal 1040 controls the multiplexer 1025. The fine time stamp obtained when the clk signal 1030 is fed to the synch block 1020 corresponds to the calibration offset. The value of the calibration offset is stored in a dedicated register or offset correction register (not shown) that is provided for each per channel. The offset value is subtracted from the fine time stamp of subsequent events during normal operation. After subtraction of the offset value, the correction algorithm is applied. The calibration can be performed periodically, for example, when the coarse counter wraps.

As shown, the synch block 1020 provides a ready_MSB signal 1045, a sample_LSB signal 1050 and a bit-half signal 1055. The sample_LSB signal 1050 is provided to a latch and decoder module 1060 which receives an input 1065 from a DLL (not shown) that is used to define the LSB part of the time stamp, and provides an output 1070 that is input to a LSB register 1080. The ready_MSB signal 1045 is input to a MSB counter 1085 for sampling the value of the coarse counter as described above. A controller and calibration module 1090 is also provided that receives the bit_half signal 1055 and generates the clk signal 1030. The controller and calibration module 1090 also interacts with the LSB register 1080 as shown.

Figure 13:
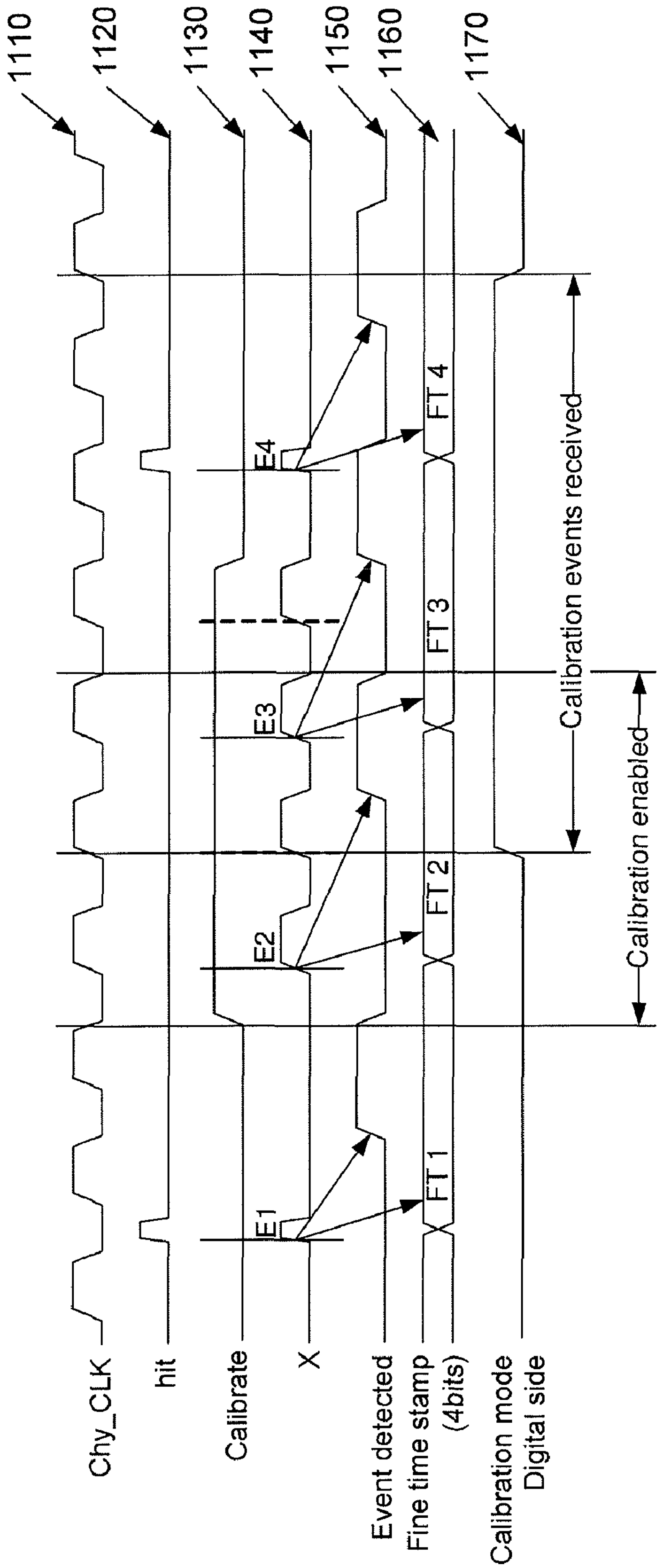
FIG. 13 illustrates a timing diagram during calibration.

FIG. 13 illustrates the operation of the implementation 1000. Plots are shown of the clk signal 1110, the event signal 1120, the calibrate signal 1130, the output signal 1140 from the multiplexer (1035 in FIG. 12), event detection 1150, the fine time stamp 1160 and the calibration mode signal 1170. Two calibration events E2, E3 are shown in addition to an event E1 that arrived before the beginning of a calibration window 1135 and an event E4 that arrived after the end of the calibration window 1135. The calibration window 1135 lasts 4 LSB.

FT1, FT2, FT3, FT4 are the fine time stamps that correspond to respective ones of the events E1, E2, E3, E4. FT2 and FT3 correspond to the offset in this particular channel. In the digital side, FT2 and FT3 update the offset correction register. This means that, at the end, FT3 is used for subsequent subtractions. The signal calibration mode indicates that the chip is calibrating and it is used to capture the fine time stamp corresponding to the time offset. The fine time stamp corresponding to events, in this case E4, that occur after the calibration are corrected with the last captured offset value.

It will be appreciated that FIG. 12 illustrates the circuit that can be used for a single channel. However, for a multi-channel system, only the analogue front end 1010 needs to be replicated for each channel. The multiplexer 1025 receives the output signals 1015 indicating the detection of an event for each channel and passes them to the synch block for processing. In this way, multiple channels, for example, 32 channels can be monitored and processed in real-time as the system provides both real-time calibration and correction for each of the channels.

In one embodiment, offset in each channel can be different. As these offset values are stored in a dedicated register or offset correction register associated with each per channel, it is possible to accommodate simultaneous measurements on different channels. A single DLL is used for generating sub-intervals from which the offset values are determined for all channels. The DLL is sampled independently for each channel when an event is detected in the relevant channel.

In addition, the circuit of one embodiment can also compensate for temperature variations and variations due to ageing.

Figure 14:
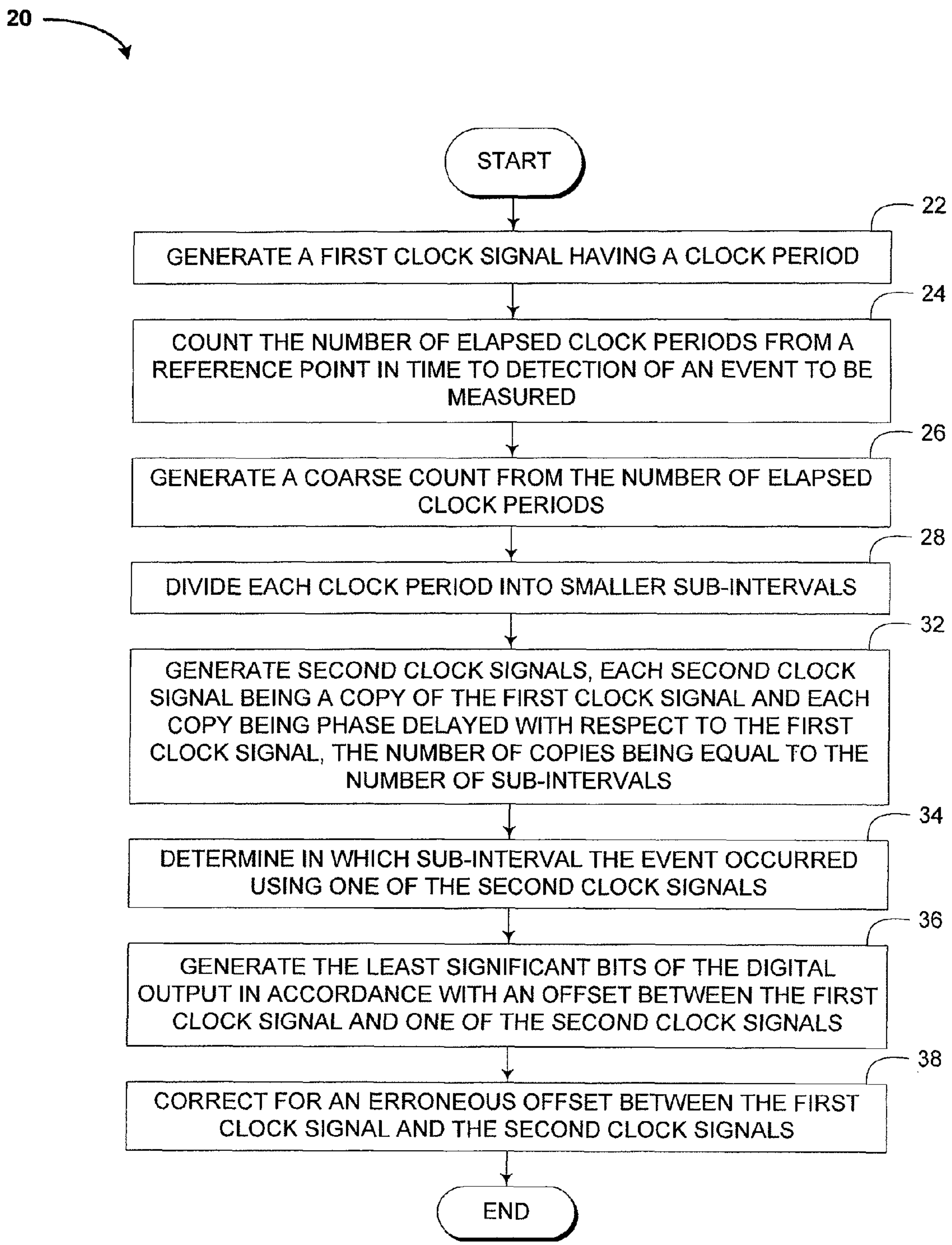
FIG. 14 shows a flowchart of one embodiment of a method of correcting an erroneous offset in a digital output generated by a time-to-digital conversion circuit.

FIG. 14 shows a flowchart of one embodiment of a method of correcting an erroneous offset in a digital output generated by a time-to-digital conversion circuit. Depending on the embodiment, certain blocks of the method may be removed, merged together, or rearranged in order.

The method 20 starts at a block 22, wherein a first clock signal having a clock period is generated. Moving to block 24, the method includes counting the number of elapsed clock periods from a reference point in time to detection of an event to be measured. Next at block 26, a coarse count is generated from the number of elapsed clock periods. Moving to block 28, each clock period is divided into smaller sub-intervals. Next at block 32, a plurality of second clock signals are generated, wherein each second clock signal is a copy of the first clock signal and each copy is phase delayed with respect to the first clock signal. The number of copies is equal to the number of sub-intervals. Moving to block 34, it is determined in which sub-interval the event occurred using one of the plurality of second clock signals. Next at block 36, the method includes generating the least significant bits of the digital output in accordance with an offset between the first clock signal and one of the plurality of second clock signals. Moving to block 38, the method includes correcting for an erroneous offset between the first clock signal and second clock signals. The process of correcting an erroneous offset may include determining in which half of the first clock period the event occurred to correct for the erroneous offset.

In some of the foregoing embodiments, correction of offset applied to time stamps generated in response to an event is described. Each time stamp comprises a coarse count and a fine count. The fine count may have an offset, which if not corrected properly, creates a rollover providing an error in the digital output corresponding to the time stamp. Rollover is prevented by knowing, for each event to be time stamped, the half of the clock period in which the event occurred. A circuit (1000) can be utilized for determining a flag relating to the event, the flag being indicative of the half of the clock period in which the event occurred. The circuit (1000) comprises an analogue front end (1010) associated with every channel to be monitored, and a digital processor (1025, 1060, 1080, 1085, 1090) that processes event signals (1015) from each analogue front end (1010) to determine the time stamp for each event occurring in a multi-channel system. A method of operation of the circuit (1000) is also disclosed.

The foregoing description details certain embodiments of the disclosure. It will be appreciated, however, that no matter how detailed the foregoing appears in text, the disclosure may be practiced in many ways. It should be noted that the use of particular terminology when describing certain features or aspects of the disclosure should not be taken to imply that the terminology is being re-defined herein to be restricted to including any specific characteristics of the features or aspects of the disclosure with which that terminology is associated.

While the above detailed description has shown, described, and pointed out novel features of the disclosure as applied to various embodiments, it will be understood that various omissions, substitutions, and changes in the form and details of the device or process illustrated may be made by those skilled in the technology without departing from the spirit of the disclosure.

What is claimed is:

1. A time-to-digital conversion circuit for providing a digital output indicative of a time at which an event occurred, the conversion circuit comprising:

a clock configured to generate a first clock signal having a clock period;

a coarse timing circuit configured to count the number of elapsed clock periods from a reference point in time to detection of the event to be measured, wherein the coarse timing circuit generates a coarse count corresponding to the most significant bits of the digital output;

a time division circuit configured to divide the clock period into smaller sub-intervals by generating a plurality of second clock signals, each second clock signal being a copy of the first clock signal and each copy being phase delayed with respect to the first clock signal, the number of copies being equal to the number of sub-intervals;

a fine timing circuit configured to determine in which sub-interval of the clock period the event occurred, wherein the fine timing circuit generates the least significant bits of the digital output; and a correction circuit configured to correct an erroneous offset between the first and second clock signals in the fine timing circuit, wherein the correction circuit further comprises a synch circuit configured to determine in which half of the clock period the event occurred to correct for the erroneous offset in the fine timing circuit.

2. The circuit according to claim 1, wherein the synch circuit determines a bit_half flag that identifies the half of the clock period in which the event occurred.

3. The circuit according to claim 1, wherein the time division circuitry comprises a decoder module, and the synch circuit generates a signal for the decoder module when the least significant bit needs to be sampled.

4. The circuit according to claim 1, wherein the correction circuit further comprises a calibration circuit configured to determine a time offset value between the first clock signal and one of the second clock signals in each calibration phase, wherein the calibration circuit stores the time offset value for subsequent use with all subsequent events until the next calibration phase.

5. The circuit according to claim 1, wherein the time division circuit comprises a delay locked loop.

6. The circuit according to claim 1, wherein the time division circuit comprises a delay line.

7. A method of correcting an erroneous offset in a digital output generated by a time-to-digital conversion circuit, the method comprising:

a) generating a first clock signal having a clock period;

b) counting the number of elapsed clock periods from a reference point in time to detection of an event to be measured;

c) generating a coarse count from the number of elapsed clock periods;

d) dividing each clock period into smaller sub-intervals;

e) generating a plurality of second clock signals, each second clock signal being a copy of the first clock signal and each copy being phase delayed with respect to the first clock signal, the number of copies being equal to the number of sub-intervals;

f) determining in which sub-interval the event occurred using one of the plurality of second clock signals;

g) generating the least significant bits of the digital output in accordance with an offset between the first clock signal and one of the plurality of second clock signals; and h) correcting for an erroneous offset between the first clock signal and second clock signals, the process of correcting an erroneous offset comprising determining in which half of the first clock period the event occurred to correct for the erroneous offset.

8. The method according to claim 7, wherein the process h) comprises subtracting the offset from the least significant bits and applying a correction in accordance with a flag indicating the half of the clock period in which the event occurred.

9. The method according to claim 7, wherein the process h) comprises determining a bit_half flag that identifies the half of the clock period in which the event occurred.

10. The method according to claim 7, wherein the process h) further comprises determining a time offset value between the first clock signal and one of the second clock signals in each calibration phase, and storing the time offset value for subsequent use with all subsequent events until the next calibration phase.

11. A circuit for correcting an erroneous offset in a digital output generated by a time-to-digital conversion circuit, the circuit comprising:

means for generating a first clock signal having a clock period;

means for counting the number of elapsed clock periods from a reference point in time to detection of an event to be measured;

means for generating a coarse count from the number of elapsed clock periods;

means for dividing each clock period into smaller sub-intervals;

means for generating a plurality of second clock signals, each second clock signal being a copy of the first clock signal and each copy being phase delayed with respect to the first clock signal, the number of copies being equal to the number of sub-intervals;

means for determining in which sub-interval the event occurred using one of the plurality of second clock signals;

means for generating the least significant bits of the digital output in accordance with an offset between the first clock signal and one of the plurality of second clock signals; and means for correcting for an erroneous offset between the first clock signal and second clock signals, the correcting means comprising means for determining in which half of the first clock period the event occurred to correct for the erroneous offset.

* * * * *